United States Patent [19]

Wanger

[11] 4,208,550
[45] Jun. 17, 1980

[54] MAGNETIC PARALLEL-TO-SERIAL CONVERTER FOR GAS TURBINE ENGINE PARAMETER SENSOR

[75] Inventor: Robert P. Wanger, Fairfield, Ohio
[73] Assignee: General Electric Company, Cincinnati, Ohio
[21] Appl. No.: 883,071
[22] Filed: Mar. 3, 1978
[51] Int. Cl.² .................... H04J 3/04; H03K 13/00
[52] U.S. Cl. .................... 370/113; 340/347 P; 370/117; 364/100
[58] Field of Search .................... 179/15 AM, 15 BL; 340/183, 189, 347 P

[56] References Cited

U.S. PATENT DOCUMENTS

| | | | |
|---|---|---|---|
| 2,951,242 | 8/1960 | Fisher, Jr. et al. | 365/83 |
| 3,068,464 | 12/1962 | Takahashi et al. | 340/347 P |
| 3,090,034 | 5/1963 | Fredericks et al. | 364/900 |
| 3,395,250 | 7/1968 | Lien | 179/15 AM |
| 3,505,659 | 4/1970 | Kelley et al. | 365/189 |
| 3,909,811 | 9/1975 | Adler | 179/15 BL |

Primary Examiner—Thomas A. Robinson
Attorney, Agent, or Firm—Derek P. Lawrence

[57] ABSTRACT

A converter is provided for transforming the parallel output of a remotely located gas turbine engine parameter sensor into serial form for transmission to an engine control unit. The converter is comprised of an interrogator which operates to sequentially interrogate a plurality of encoder magnetic cores which contain the sensed digital information. The interrogator is comprised of a plurality of magnetic elements, each of which is connected to a corresponding individual encoder magnetic core. The magnetic elements are normally maintained in a saturated state by two electrical current signals which are applied through appropriate biasing circuitry. The current signals and biasing circuitry also act to sequentially unsaturate individual magnetic elements. A high frequency excitation current is also applied to each of the magnetic elements. As each magnetic element unsaturates, an interrogation current generated by the excitation current is transmitted to a corresponding encoder magnetic core. A single output conductor is connected with all of the magnetic cores for transmitting the serial information to the control unit.

11 Claims, 6 Drawing Figures

MAGNETIC PARALLEL-TO-SERIAL CONVERTER FOR GAS TURBINE ENGINE PARAMETER SENSOR

BACKGROUND OF THE INVENTION

1. Field of the Invention

This invention relates to gas turbine engine parameter sensors and more particularly to the design and construction of a magnetic device for converting the parallel output of a digital parameter sensor into serial form for transmission to a control unit.

2. Description of the Prior Art

As gas turbine engine control systems have become more sophisticated the tendency has been utilize more digital computers and digital controls. A natural outgrowth of the trend towards digital control systems has been the development of direct digital engine parameter sensors to replace the traditional analog sensors the output of which required conversion to digital signals prior to bein useful to a digital control system. Typical of these direct digital sensors is a magnetic shaft encoder which provides a digital indication of the angle of a shaft by saturating or unsaturating a number of encoder magnetic cores.

While such direct digital engine parameter sensors represent a tremendous advancement in the field of gas turbine engine controls, they do present one major problem. Due to their inherent operational nature, their output is presented in parallel form. Thus, in order to obtain accurate parameter information it is necessary to have an individual conductor for each bit of information sensed. For example, a magnetic shaft encoder capable of position sensing with eight-bit accuracy would require nine conductors running between the sensor and the engine control unit (one for sending an excitation current to the magnet shaft encoder and one for sending each of the eight bits of information back to the engine control unit).

While a few additional conductors may not be particularly important with respect to an individual sensor, as gas turbine engine control systems have become more sophisticated, the number of such sensors has increased and the multiplicity of such conductors has become highly significant in terms of space and weight complications.

It therefore became highly desirable to convert the parallel output of direct digital engine parameter sensors into serial form for transmission to the engine control unit over a single conductor. However, because of the temperature extremes (−65° F. to 400° F.) involved with remotely located engine parameter sensors, the use of conventional electronic parallel-to-serial-conversion techniques was found to be impractical. The problem of converting parallel digital information to serial form at remote engine sensor locations without the use of conventional electronics is overcome by the present invention.

An object of the present invention is to provide a magnetic parallel-to-serial converter for use at remote sensor locations which will significantly reduce the number of conductors between the remote sensor and the engine control unit.

A further object of the present invention is to provide a magnetic parallel-to-serial converter which will operate effectively over a widely varying temperature range.

SUMMARY OF THE INVENTION

In accordance with the present invention, there is provided a magnetically operated device for converting the parallel output of a remotely located gas turbine engine parameter sensor into serial form for transmission to an engine control unit. The device is comprised of an interrogator which operates to sequentially provide an interrogation current to a plurality of encoder magnetic cores which contain sensed digital information. The sequential interrogator itself is comprised of a plurality of magnetic elements, each of which is electrically connected to a corresponding one of the encoder magnetic cores. All of the magnetic elements are normally maintained in the saturated state. A high frequency excitation current is supplied by the control unit to all of the magnetic elements. By sequentially unsaturating the magnetic elements, an interrogation current is generated by the excitation current and is transmitted to sequentially interrogate the encoder magnetic cores, thereby serially transmitting the data to the control unit over a single output conductor which is connected in series with all of the encoder magnetic cores.

The magnetic elements are maintained in the saturated state and sequentially unsaturated through the use of two electrical current signals and appropriately connected biasing circuitry. In the preferred embodiment, the current signals consist of a positive ramp and a negative ramp and the biasing circuitry is comprised of two resistive current dividing networks. Each of the ramp current signals is applied to one of the current dividing networks so that at any given time, the combination of the two ramp currents will maintain saturation in all but one of the magnetic elements. The ramp currents at this magnetic element will combine to provide a net current near zero, thereby causing it to unsaturate. The characteristics of the ramp current signals are such that the magnetic elements will be unsaturated sequentially.

DESCRIPTION OF THE PREFERRED EMBODIMENT

Figure 1:
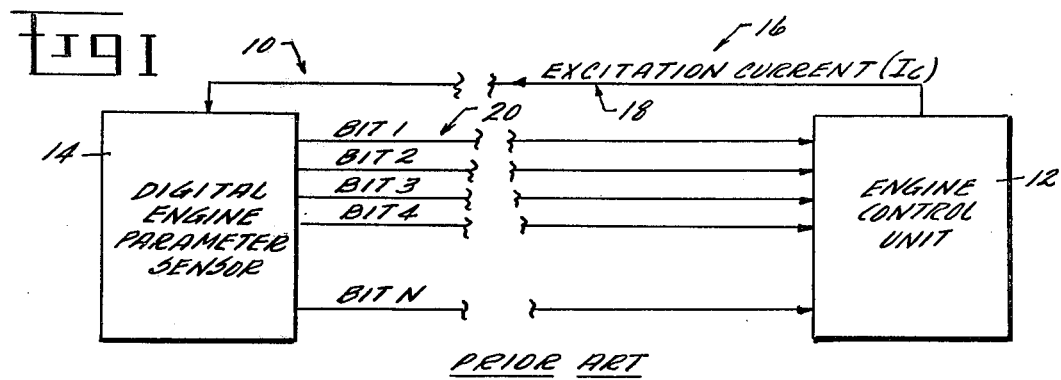
FIG. 1 is a block diagram of the prior art.

The present invention in one form thereof, comprises generally a magnetic device for converting the parallel output of a digital parameter sensor for a gas turbine engine into serial form for transmission to a gas turbine engine control unit. As shown in FIG. 1, prior art gas turbine control systems, denoted generally as 10, include an engine control unit 12, a plurality of digital engine parameter sensors, one of which is denoted as 14, and a number of interconnecting conductors, denoted generally as 16.

The digital engine parameter sensor 14 may be a magnetic shaft encoder or any other type of sensor which provides a parallel digital output signal for transmission to the engine control unit 12. The interconnecting conductors 16 consist of a single conductor 18 for transmitting an excitation current $I_c$ from the engine control unit 12 to the digital engine parameter sensor 14 and a plurality of a sensor output conductors 20. Each of the sensor output conductors 20 is utilized to transmit one bit of digital information from the digital engine parameter sensor 14 to the engine control unit 12. It is therefore necessary to a have a separate sensor output conductor running from the digital engine parameter sensor 14 to the engine control unit 12 for each bit of information generated by the sensor. For example, a typical magnetic shaft encoder sensor may generate eight bits of information, thereby requiring eight individual sensor output conductors. Thus, the minimum number of interconnecting conductors 16 running between the engine control unit 12 and each of the digital engine parameter sensors would be nine. When multiplied by the increasing number of such digital parameter sensors being employed on state-of-the-art gas turbine engines the total becomes highly significant in terms of both the space and weight requirements involved in utilizing such a large number of these conductors.

Figure 2:
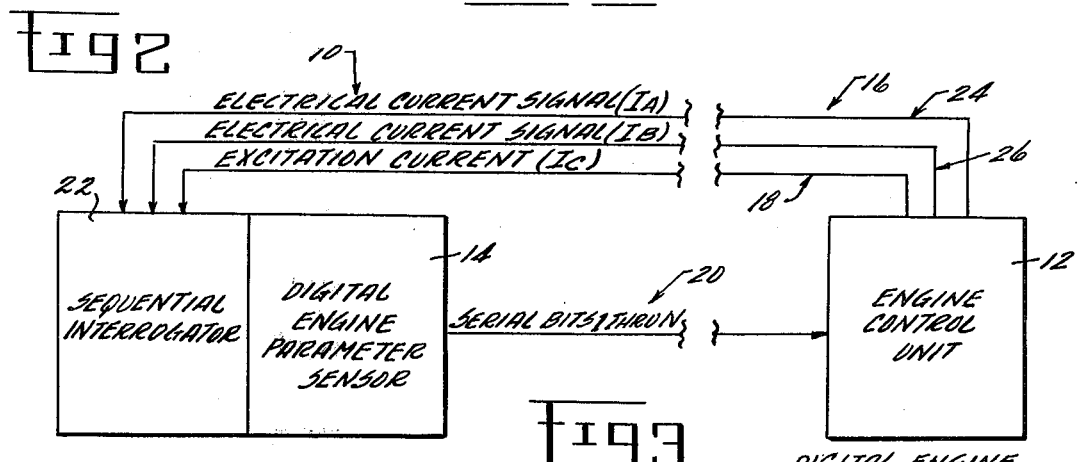
FIG. 2 is a block diagram of the present invention which emphasizes the advantages over the prior art.

Referring now to FIG. 2, wherein a simplified block diagram of the present invention is shown, a sequential interrogator 22 (described in more detail below) has been added and is disposed in the immediate vicinity of the prior art digital engine parameter sensor 14 and the number of interconnecting conductors 16 between the sensor and the engine control unit 12 has been greatly reduced. The interconnecting conductors 16 now comprise only four: the excitation current conductor 18; a pair of electrical current signal conductors 24 and 26; and a single sensor output conductor 20. The excitation current conductor 18 now transmits the excitation current from the engine control unit 12 to the sequential interrogator 22. Electrical current signal conductors 24 and 26 have been added to transmit electrical current signals $I_A$ and $I_B$, respectively, from the engine control unit 12 to the sequential interrogator 22. The single sensor output conductor 20 transmits all of the digital information from the digital engine parameter sensor 14 to the engine control unit 12. Thus, as seen by comparing FIG. 1 with FIG. 2, the present invention results in a reduction of the number of interconnecting conductors 16 involved with a typical eight-bit magnetic shaft encoder sensor from nine to four. This elimination of five conductors per sensor becomes highly significant when it is multiplied by the number of such sensors employed on a gas turbine engine.

Figure 3:
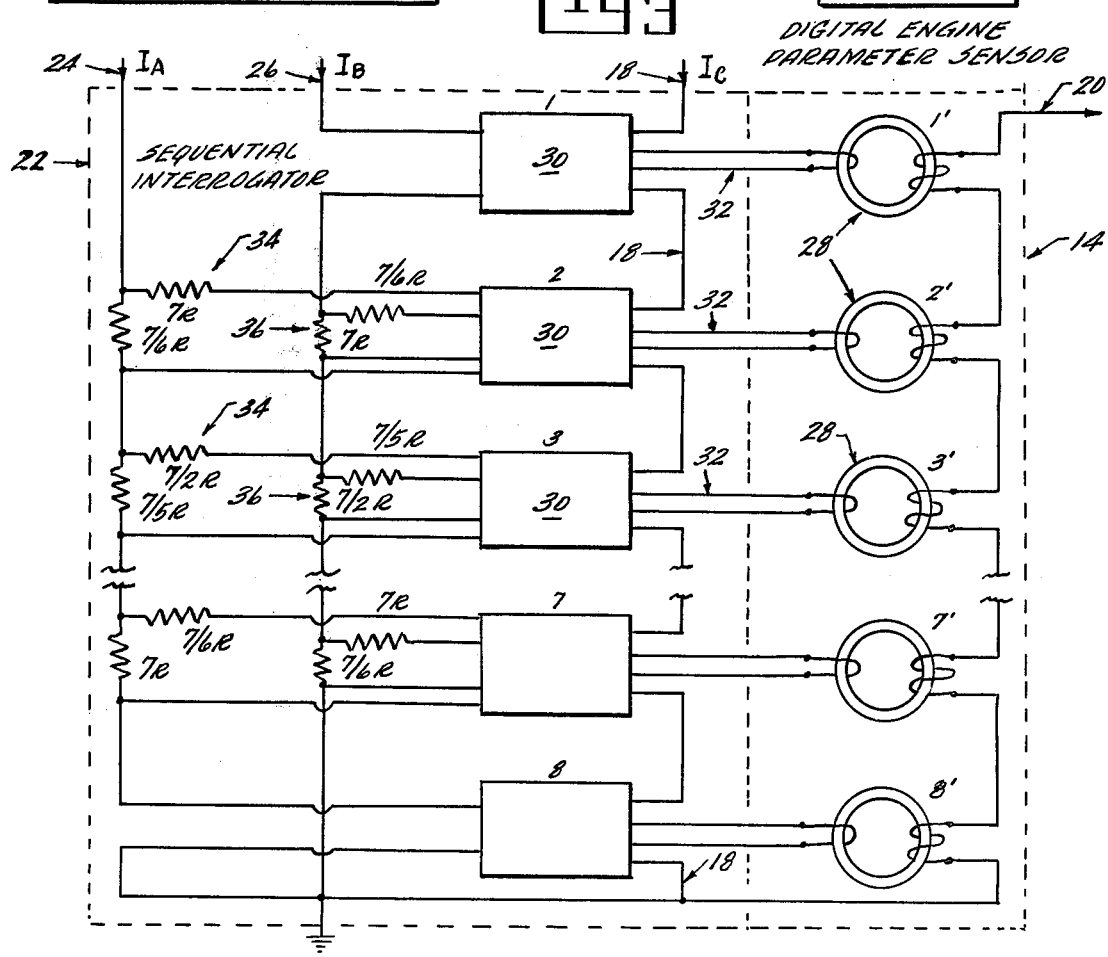
FIG. 3 is a detailed circuit diagram of the preferred embodiment of the present invention.

Referring now to FIG. 3, a detailed circuit diagram of the preferred embodiment of the present invention is disclosed. The digital engine parameter sensor 14 is an eight-bit magnetic shaft encoder sensor containing eight encoder magnetic cores 28 each of which is either in the saturated or unsaturated state depending upon the current status of the sensed parameter. The single sensor output conductor 20 is connected with all eight of the encoder magnetic cores 28 in series.

The sequential interrogator 22 is composed generally of eight magnetic elements 30 each of which is electrically connected to conductors 32 to a corresponding encoder magnetic core 28 (e.g. magnetic element 1 is connected to encoder magnetic core 1', etc.). Excitation current conductor 18 is serially connected with all of the magnetic elements 30. A pair of current dividing networks 34 and 36 are also connected to the magnetic elements 30 and operate with current signals $I_A$ and $I_B$, respectively, in order to generally maintain all of the magnetic elements 30 in a saturated state while sequentially unsaturating individual magnetic elements.

Each of the current dividing networks 34 and 36 is comprised of six pairs of parallel resistors which have been connected together in series. The ratios of the resistors in the current dividing networks 34 and 36 have been designed to operate in connection with current signals $I_A$ and $I_B$ to provide the following current ratios to each of the magnetic elements 30.

TABLE 1

| Magnetic Element | Current Provided by Network 34 | Current Provided by Network 36 |
|---|---|---|
| 1 | 0 | $I_B$ |
| 2 | $1/7\,I_A$ | $6/7\,I_B$ |
| 3 | $2/7\,I_A$ | $5/7\,I_B$ |
| 4 | $3/7\,I_A$ | $4/7\,I_B$ |
| 5 | $4/7\,I_A$ | $3/7\,I_B$ |
| 6 | $5/7\,I_A$ | $2/7\,I_B$ |
| 7 | $6/7\,I_A$ | $1/7\,I_B$ |
| 8 | $I_A$ | 0 |

As can be seen from Table 1, none of the current signal $I_A$ is applied through current dividing network 34 to the first magnetic element and the ratioed portion of current signal $I_A$ which is applied to the second through eighth magnetic element successively proportionally increases so that all of current signal $I_A$ is applied to the eighth magnetic element. Likewise, all of the current signal $I_B$ is applied through current dividing network 36 to the first magnetic element and the ratioed portion of current signal $I_B$ which is applied to the second through eighth magnetic element successively proportionally decreases so that none of current signal $I_B$ is applied to the eighth magnetic element.

Figure 4:
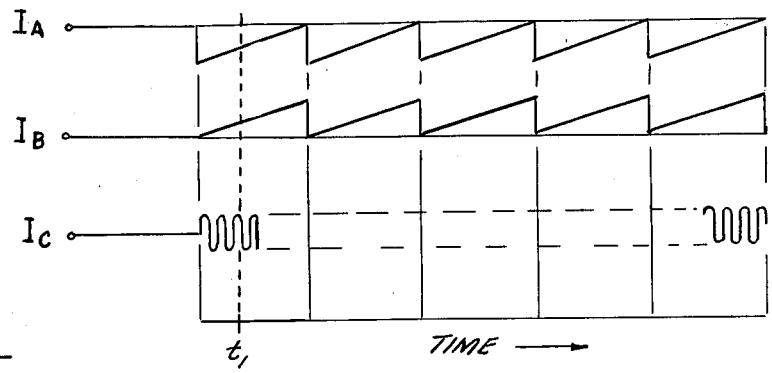
FIG. 4 is a time sequence chart of the various currents employed in the preferred embodiment of the present invention.

As shown in FIG. 4, current signal $I_A$ consists of a negative ramp and current signal $I_B$ consists of a positive ramp. Each of these current signals is provided by electronic ramp generators (not shown) of a type well known in the art. Thus, the total current applied to an individual magnetic element at a given time is obtained by algebraically adding the ratioed portion of the value of ramp current signal $I_A$ with the respective ratioed portion of the value of ramp current signal $I_B$. As long as the total current applied to the magnetic element has some appreciable value either positive or negative, the magnetic element will remain in its saturated state. When the total current applied to a magnetic element is near zero, the magnetic element becomes unsaturated. Utilizing magnetic element number 3 as an example, the total current $I_T$ applied to this element would be established by the following formula:

$$I_T = 2/7\,I_A + 5/7\,I_B$$

As long as $I_T$ has some appreciable value (either positive or negative;), magnetic element 3 will continue in its saturated state. When $I_T$ is near zero, magnetic element 3 will become unsaturated. From the above formula it is readily apparent that $I_T$ will be zero when $$1/7\,I_A = 5/7\,I_B$$

Figure 6:
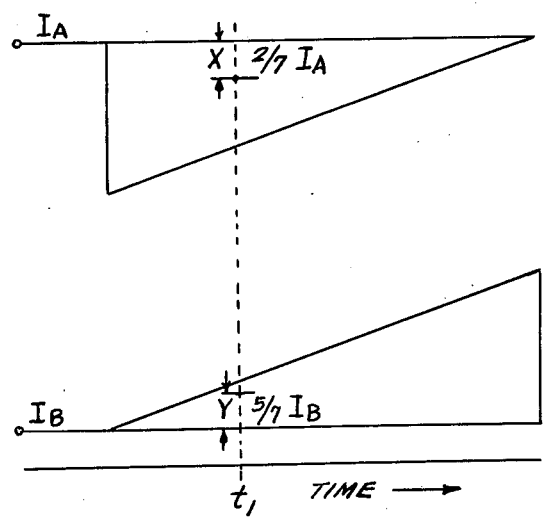
FIG. 6 shows an enlarged view of a portion of the time sequence chart of FIG. 4.

As best seen in FIG. 6, at the time $t_1$ the value of $1/7\,I_A$ (denoted as X) will be approximately equal to the value of 5/7 $I_B$ (denoted as Y), thereby unsaturating magnetic element 3.

Generalizing with respect to all of the magnetic elements 30, it is readily apparent from Table 1 that each such magnetic element will become unsaturated when the current delivered to it by current dividing network 34 is approximately equal to the current delivered to it by current dividing network 36. The nature of ramp current signals $I_A$ and $I_B$ as shown in FIGS. 4 and 6 is such that the unsaturation of the magnetic elements 30 will occur sequentially.

Figure 5:
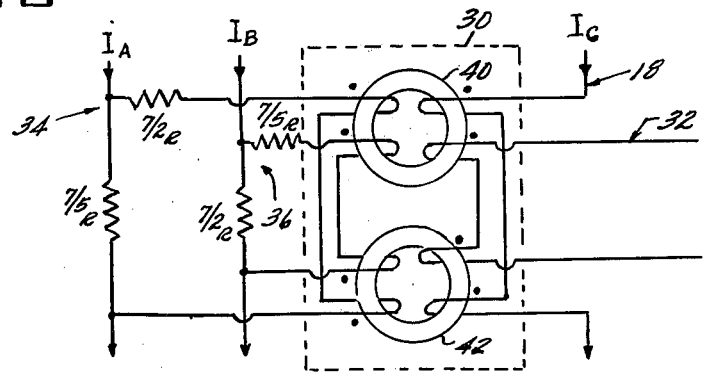
FIG. 5 shows details of the third magnetic element of the circuitry of FIG. 3.

It is desirable to prevent any current generated by current signals $I_A$ and $I_B$ from being transmitted to sensor output conductor 20. Therefore,, as shown in FIG. 5, each of the magnetic elements 30 is composed of two individual magnetic cores 40 and 42, both of which will be either in the saturated or unsaturated state at the same time. As denoted by the dots of FIG. 5, the conductors of current dividing network 34 are looped through both of the magnetic cores so that the sense of magnetic core 40 with respect to current signal $I_A$ is opposite that of magnetic core 42 with respect to current signal $I_A$. The conductors of current dividing network 36 are looped through both of the magnetic cores in the same manner. Thus, when both magnetic cores are in the unsaturated state, the current generated by current signal $I_A$ through magnetic core 40 will be equal and opposite to the current generated by current signal $I_A$ through magnet core 42, thereby cancelling each other out and preventing any current generated by current signal $I_A$ from passing through conductor 32 to the interrogated encoder magnetic core 28. Current generated by current signal $I_B$ will also be effectively prevented from reaching the interrogated encoder magnetic core 28 in the same manner.

The excitation current conductor 18 is looped through both of the magnetic cores 40 and 42 with the same sense. Thus, when both magnetic cores are in the unsaturated state, an interrogation current generated by excitation current $I_C$ through magnetic core 40 will combine with an interrogation current generated by excitation current $I_C$ through magnetic core 42 to provide a strong total interrogation current through conductor 32 to the interrogated encoder magnetic core 28.

In operation, when an individual magnetic element unsaturates, it becomes conductive and passes an interrogation current generated by the excitation current $I_C$ onto its respective conductor 32. The conductor 32 in turn applies the generated interrogation current to its respective encoder magnetic core 28. If the particular interrogated encoder magnetic core is not saturated, then the particular core generates a current which is passed onto the sensor output conductor 20 for transmission to the engine control unit 12. If the particular interrogated encoder magnetic core is saturated then it will not generate a current in response to the interrogation current and no current will be placed onto the sensor output conductor 20. Thus, the information generated by the digital engine parameter sensor 14 and stored in parallel form in encoder magnetic cores 28 is effectively transmitted to the engine control unit 12 in serial form.

From the foregoing description it can be seen that the present invention provides a device for converting the parallel digital output of a remotely located gas turbine engine parameter sensor into serial form for transmission to an engine control unit. The net result is a significant reduction in the number of conductors interconnecting the engine control unit and the remotely located sensor, and a corresponding reduction in the weight and space which would have been associated with the eliminated conductors. Because the device employs magnetics, as opposed to conventional electronics, to achieve the parallel-to-serial conversion it is able to operate effectively despite the severity of the temperatures associated with remotely located gas turbine engine parameter sensors.

It will be obvious to one skilled in the art that certain changes can be made to the above-described invention without departing from the broad inventive concepts thereof. For example, a different number of magnetic cores could be employed as the magnetic elements. In addition, turns ratios could be, substituted for the resistor current dividing networks and different electrical current signals could be substituted for ramp current signals $I_A$ and $I_B$. The entire interrogation cycle could also be varied to provide for periodic interrogations with various delay times in between.

It is to be understood, therefore, that this invention is not limited to the particular embodiment disclosed, but it is intended to cover all modifications which are within the spirit and scope of this invention as claimed.

What is claimed as new and desired to be secured by Letters Patent of the United States is:

1. In a gas turbine engine control system having a plurality of sensors disposed at locations which are subject to extreme variations in temperature, said sensors providing parallel digital signals which are indicative of various engine parameters, said control system further including a control unit which responds to said digital signals and develops control signals for controlling the operation of said engine, the improvement comprising means for converting said parallel digital signals into serial signals for transmission to said control unit, said converting means including:
    (a) a plurality of encoder magnetic cores for storing sensed digital information, said magnetic cores being disposed in the immediate vicinity of said sensors and being subject to said extreme variations in temperature;
    (b) a plurality of magnetic elements located at each sensor, each element being connected to a corresponding one of said encoder magnetic cores;
    (c) means serially connected with all of said magnetic elements for supplying an excitation current thereto;
    (d) first and second current dividing networks located at each sensor; and
    (e) means for providing a first electrical current signal to the first of said networks and a second electrical current signal to the second of said networks,
each of said current dividing networks being connected to said magnetic elements in a manner such that the simultaneous application of said first and second electrical current signals to the first and second current dividing networks respectively will result in normally maintaining the magnetic elements in saturation while sequentially unsaturating individual magnetic elements in order to correspondingly sequentially transmit an interrogation current to said encoder magnetic cores, said interrogation current being generated by said excitation current and being adapted to interrogate said encoder magnetic cores in order to provide said serial signals.

2. The control system of claim 1, wherein each of said magnetic elements includes two magnetic cores, each of said current dividing networks being connected to said magnetic cores so that the sense of the individual cores is opposite and said excitation current supplying means being connected to said magnetic cores so that the sense of the individual cores is the same.

3. The control system of claim 1, wherein:
said first current dividing network is connected to said magnetic elements so that none of said first electrical current signal is applied to the first of said magnetic elements and the ratioed portion of said first electrical current signal which is applied to the second through the last of said magnetic elements successively proportionally increases so that all of said first electrical current signal is applied to the last of said magnetic elements; and
said second current dividing network is connected to said magnetic elements so that all of said second electrical current signal is applied to the first of said magnetic elements and the ratioed portion of said second electrical current signal which is applied to the second through last of said magnetic elements successively proportionally decreases so that none of said second electrical current signal is applied to the last of said magnetic elements.

4. The control system of claim 1, wherein the said current dividing networks are comprised of resistors.

5. The control system of claim 1, wherein said first electrical current signal is comprised of a positive ramp signal, said second electrical current signal is comprised of a negative ramp signal, both of said ramp signals being time-synchronized and of equal magnitude.

6. A circuit for effecting serial transmission of digital information from a plurality of magnetic encoder devices, located in the vicinity of a gas turbine, to a remote location, each device being adapted to assume saturated and unsaturated states, said circuit comprising:
(a) a plurality of magnetic interrogating elements located at the encoder devices, each element being connected to supply an interrogation current to a respective one of the encoder devices;
(b) means including a serial connection of the interrogating elements for supplying an excitation current signal thereto;
(c) means for supplying first and second saturation current signals;
(d) a first current dividing network connected to receive the first saturation current signal; and
(e) a second current dividing network connected to receive the second saturation current signal,
each of the networks being connected to the interrogating elements in a manner such that the simultaneous application of the first and second saturation current signals to the networks results in normally maintaining the interrogating elements in saturation while sequentially unsaturating individual interrogating elements and causing the excitation current to effect the sequential application of the interrogation current to the magnetic encoder devices; said sequential application resulting in serial transmission of the digital information therefrom.

7. The control system of claim 6, wherein each of the interrogating elements includes two magnetic cores, each of the current dividing networks being connected to both of the magnetic cores of each interrogating element and adapted to magnetize the cores in opposite directions, and wherein the excitation current supplying means is connected to both magnetic cores of each interrogating element and is adapted to magnetize the cores in the same direction.

8. The control system of claim 6, wherein the first current dividing network is connected such that a first one of the interrogating elements receives none of the first saturation current, the last one of the interrogating elements receives the full first saturation current and the remaining interrogating elements each receive progressively increasing ratioed portions of the first saturation current; and the second current dividing network is connected such that the first one of the interrogating elements receives the full second saturation current, the last one of the interrogating elements receives none of the second saturation current and the remaining interrogating elements each receive progressively increasing ratioed portions of the second saturation current.

9. The control system of claim 6, wherein each of the current dividing networks comprises a resistive divider.

10. The control system of claim 6, wherein the means for providing the first and second saturation current signals is adapted to provide time-synchronized ramp signals of opposite polarity and equal magnitude.

11. A turbine control system having a plurality of sensors disposed at locations which are subject to extreme variations in temperature, the sensors providing parallel digital signals which are indicative of various turbine parameters, the control system further comprising a control unit responsive to the digital signals to develop control signals for controlling turbine operation, the control system further including means for converting the parallel digital signals into serial signals for transmission to the control unit, the converting means including:
(a) a plurality of encoder magnetic cores located at each sensor, each encoder core being adapted to assume a saturated and an unsaturated state representative of sensed digital information; and
(b) means for sequentially applying AC signals to the encoder magnetic cores in order to provide the serial signals.

* * * * *

UNITED STATES PATENT AND TRADEMARK OFFICE
CERTIFICATE OF CORRECTION

PATENT NO. : 4,208,550
DATED : June 17, 1980
INVENTOR(S) : Robert P Wanger

It is certified that error appears in the above-identified patent and that said Letters Patent are hereby corrected as shown below:

Column 8, line 31, claim 9, after the word "divider" add --network.--

Signed and Sealed this

*Twenty-third* Day of *September 1980*

[SEAL]

*Attest:*

SIDNEY A. DIAMOND

*Attesting Officer*    *Commissioner of Patents and Trademarks*